United States Patent
Fan

(10) Patent No.: US 7,919,715 B2
(45) Date of Patent: Apr. 5, 2011

(54) CIRCUIT BOARD READY TO SLOT

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 569 days.

(21) Appl. No.: 12/123,269

(22) Filed: May 19, 2008

(65) Prior Publication Data

US 2009/0173528 A1  Jul. 9, 2009

(30) Foreign Application Priority Data

Jan. 8, 2008 (TW) ................................ 97100754 A

(51) Int. Cl.
*H05K 1/11* (2006.01)
(52) U.S. Cl. ........ 174/261; 174/250; 174/262; 361/777; 361/783; 361/760
(58) Field of Classification Search .................. 257/735, 257/737, E23.069, E23.024; 174/250, 255, 174/260, 261, 262, 266, 538, 541; 361/748–751, 361/777, 783, 778, 760
See application file for complete search history.

(56) References Cited

U.S. PATENT DOCUMENTS

| | | | | |
|---|---|---|---|---|
| 4,967,260 A | * | 10/1990 | Butt | 257/668 |
| 6,130,110 A | * | 10/2000 | Hashimoto | 438/106 |
| 6,548,764 B1 | * | 4/2003 | Prindiville et al. | 174/255 |
| 7,098,528 B2 | * | 8/2006 | Vasishta et al. | 257/668 |
| 2003/0111726 A1 | * | 6/2003 | Khan et al. | 257/730 |
| 2004/0219713 A1 | * | 11/2004 | Lee | 438/106 |
| 2007/0209830 A1 | * | 9/2007 | Chu | 174/261 |
| 2008/0042277 A1 | * | 2/2008 | Lin | 257/738 |
| 2008/0096312 A1 | * | 4/2008 | Law et al. | 438/106 |

* cited by examiner

*Primary Examiner* — Dameon E Levi
*Assistant Examiner* — Hoa C Nguyen
(74) *Attorney, Agent, or Firm* — Muncy, Geissler, Olds & Lowe, PLLC

(57) ABSTRACT

A circuit substrate ready to slot is revealed, primarily comprising a board base with slot-reserved area. A plurality of bonding fingers, a plating bus loop, and a plurality of plating lines disposed on the bottom surface of the board base. The bonding fingers are located adjacent to but outside the slot-reserved area and the plating bus loop is located inside the slot-reserved area. The plating lines connect the bonding fingers to the plating bus lines. The plating bus loop includes two side bars closer to the long sides of the slot-reserved area than the bonding fingers to the long sides. Accordingly, the lengths of the plating lines within the slot-reserved area are shortened. It is possible to solve the issues of metal burs and shifting of the remaining plating lines when routing a slot along the peripheries of the slot-reserved area. Moreover, the plating current can evenly distribute to improve the plating qualities on the surfaces of the bonding fingers.

10 Claims, 3 Drawing Sheets

CIRCUIT BOARD READY TO SLOT

FIELD OF THE INVENTION

The present invention relates to printed circuit substrates, especially to a circuit substrate ready to slot for window-type semiconductor packages.

BACKGROUND OF THE INVENTION

The window-type BGA (Ball Grid Array) package is a very common semiconductor package using a circuit substrate with a wire-bonding slot as a chip carrier. Normally, a semiconductor chip is disposed on the top surface of the board base and a plurality of external terminals such as solder balls are disposed on the bottom surface of the board base. Moreover, a plurality of bonding fingers are also disposed on the bottom surface of the board base. The chip is electrically connected to the bonding fingers of the substrate by a plurality of bonding wires passing through the wire-bonding slot.

As shown in FIG. 1, a circuit substrate 100 serves as a chip carrier for a conventional window-type BGA package. The circuit substrate 100 primarily comprises a board base 110, a plurality of bonding wires 20, and a plurality of external pads 160. The board base 110 has a top surface 111, a bottom surface 112, a wire-bonding slot 114 penetrating through the top surface 111 and the bottom surface 112. The bonding fingers 120 are disposed on the bottom surface 112 of the board base 110 and adjacent to both long sides of the wire-bonding slot 114. The external pads 160 are disposed on the bottom surface 112 of the board base 110 in an array.

As shown in FIG. 1, the conventional window-type BGA package further comprises a chip 10, a plurality of bonding wires 20, an encapsulant 30, and a plurality of solder balls 40. The chip 10 with a plurality of bonding pads 11 is attached to the top surface 111 of the board base 110 with the bonding wires 20 passing through the wire-bonding slot 114 to electrically connect the bonding pads 11 of the chip 10 to the bonding fingers 120 of the board base 110. An encapsulant 30 encapsulates the chip 10 and the bonding wires 20. The solder balls 40 are bonded to the external pads 160 as external terminals of the conventional window-type BGA package for SMT mounting on an external printed circuit board, not shown in the figure.

As shown in FIG. 2, a plurality of the substrates 100 are integrally formed and arranged in a substrate strip 50 before package singulation where the substrate strip 50 has a plurality of scribe lines 51 to define the dimensions of the substrates 100. Normally, Ni/Au or other metal layers will be plated on the surfaces of the bonding fingers 120 of the substrates 100 first to avoid oxidation of the bonding fingers 120 and to enhance the bonding strengths between the bonding fingers 120 and the bonding wires 20. Then, the wire-bonding slots 114 are formed by routing. As shown in FIG. 3, the bottom surface 112 of the board base 110 includes a slot-reserved area 113 corresponding to the wire-bonding slot 114 before routing. In order to plating the surfaces of the bonding fingers 120, a plating bus line 150 with a plurality of plating lines 140 is disposed on the bottom surface 112 of the board base 110 passing through the center of the slot-reserved area 113 where the plating lines 140 connect the bonding fingers 120 to the plating bus line 150. Since the plating lines 140 extend into the slot-reserved area 113 with certain lengths, therefore, the plating lines 140 will be pulled and shifted during routing the slot-reserved area 113 leading to metal burrs and shifting of the plating lines 140 remaining on the edges of the slot-reserved area 113 leading to electrical short between the bonding fingers 120. Furthermore, as shown in FIG. 3, the plating lines 140 extending through both long sides of the slot-reserved area 113 are straight lines perpendicular to the plating bus line 150 according to the position variation of the bonding fingers 120 leading to different spacing between the plating lines. Therefore, current density can not evenly distribute to every plating line 140 during plating processes causing different plating thicknesses plated on the surfaces of the bonding fingers 120 leading to poor plating qualities.

SUMMARY OF THE INVENTION

The main purpose of the present invention is to provide a circuit substrate ready to slot for window-type semiconductor packages to reduce the lengths of the plating lines in a slot-reserved area to avoid metal burrs and shifting of the plating lines remaining on the slot-reserved area after routing, moreover, to evenly distribute the current density to improve plating qualities.

According to the present invention, a circuit substrate ready to slot for window-type semiconductor packages, primarily comprises a board base, a plurality of bonding fingers, a plating bus loop, and a plurality of plating lines. The board base has a top surface and a bottom surface where the bottom surface includes a slot-reserved area. The bonding fingers are disposed on the bottom surface of the board base and adjacent to but outside the slot-reserved area. The plating bus loop is disposed on the bottom surface of the board base and inside the slot-reserved area. The plating lines are disposed on the bottom surface of the board base and connecting the bonding fingers to the plating bus loop. Additionally, the plating bus loop includes two side bars closer to a plurality of long sides of the slot-reserved area than the bonding fingers to the long sides to shorten the lengths of the plating lines within the slot-reserved area.

DETAIL DESCRIPTION OF THE INVENTION

Please refer to the attached drawings, the present invention will be described by means of embodiments below.

Figure 1:
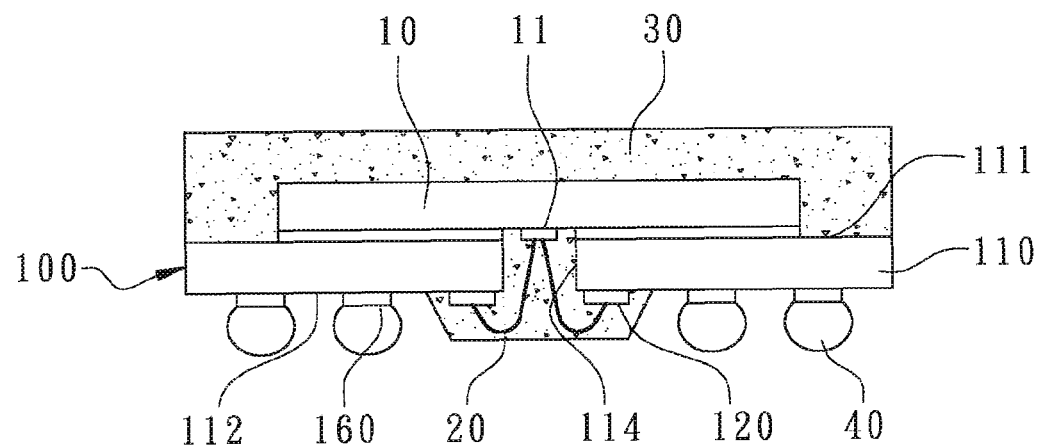
FIG. 1 shows a cross-sectional view of a conventional window-type BGA package.
Figure 2:
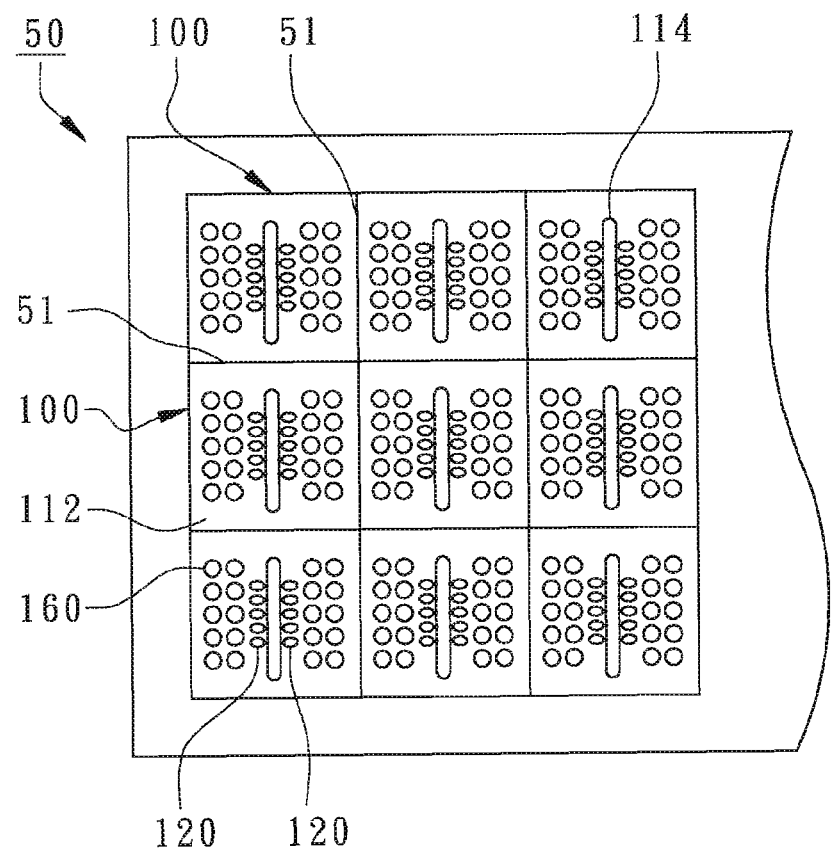
FIG. 2 shows a bottom surface of a substrate strip integrally including a plurality of circuit substrates for conventional window-type BGA packages.
Figure 3:
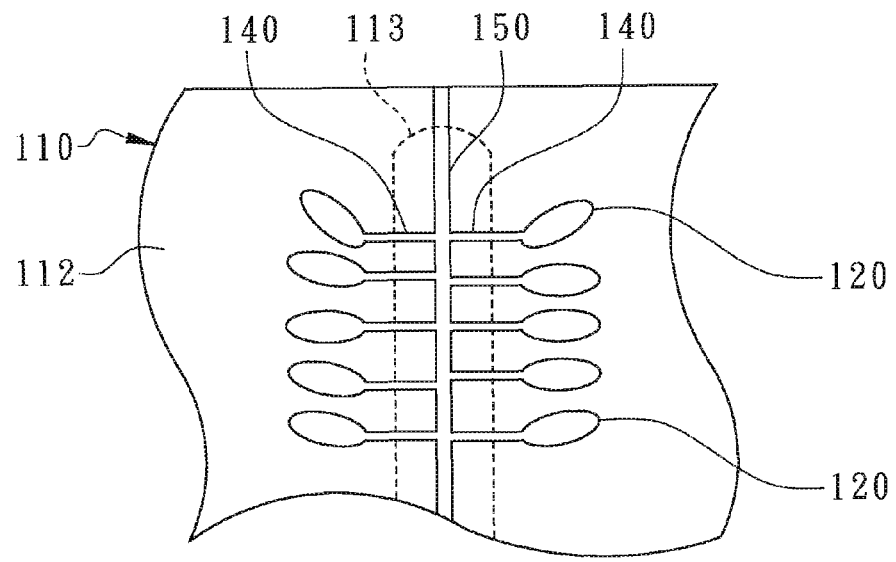
FIG. 3 shows a partial circuit layout on a bottom surface of one conventional circuit substrate before forming a wire-bonding slot.
Figure 4:
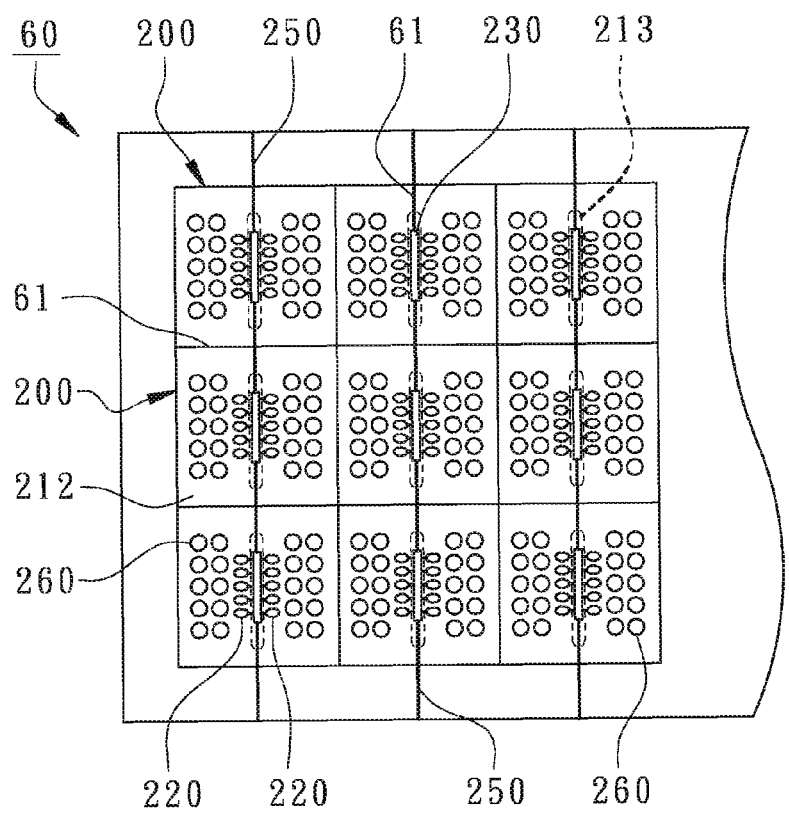
FIG. 4 shows a bottom surface of a substrate strip integrally including a plurality of circuit substrates for window-type BGA packages according to the preferred embodiment of the present invention.

According to the present invention, a plurality of circuit substrates 200 are integrally formed in a substrate strip 60, as shown in FIG. 4. The substrate strip 60 has a plurality of scribe lines 61 to define the dimensions of the circuit substrates 200. The circuit substrate 200 can be a single-layer or multiple-layer printed circuit substrate.

Figure 5:
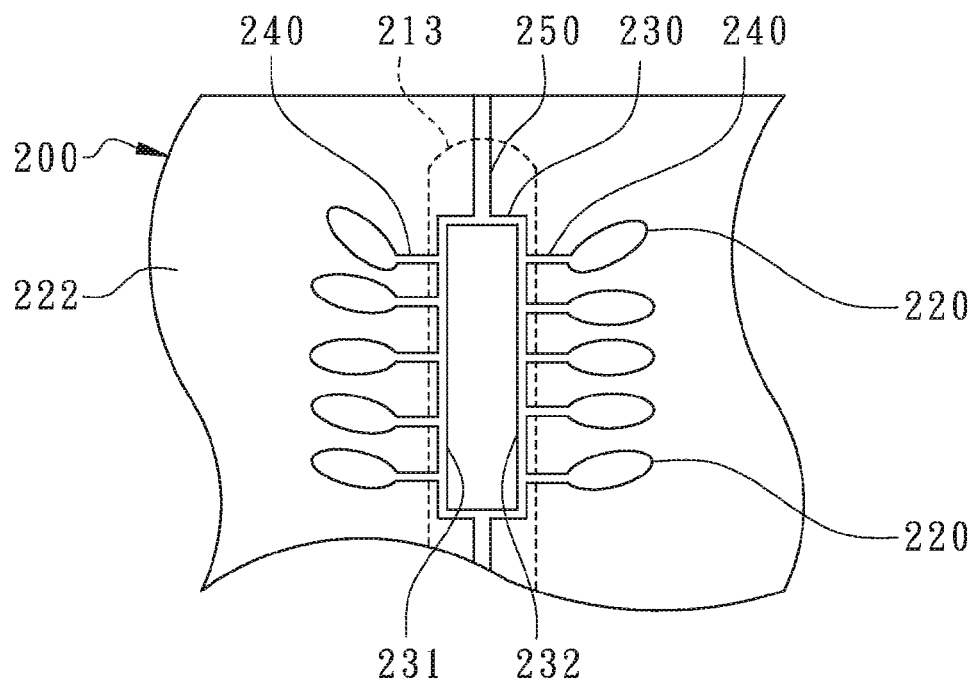
FIG. 5 shows a partial circuit layout on a bottom surface of the circuit substrate ready to slot according to the preferred embodiment of the present invention.
Figure 6:
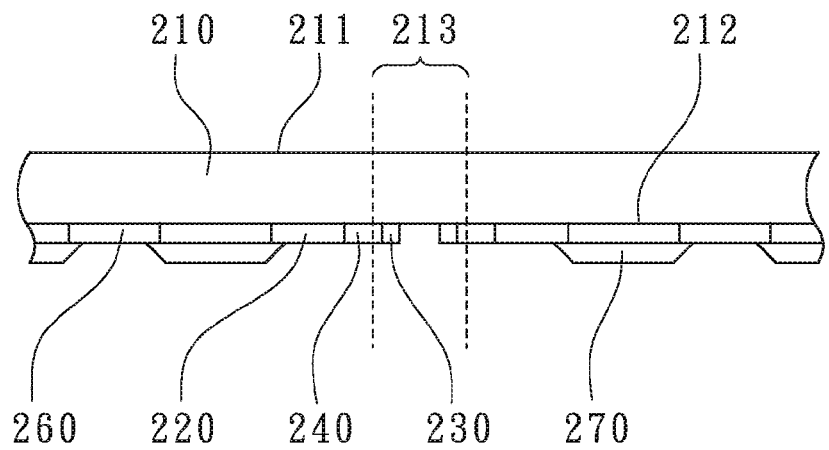
FIG. 6 shows a cross-sectional view of the circuit substrate ready to slot according to the preferred embodiment of the present invention.

As shown in FIG. 5 and FIG. 6, the circuit substrate 200 primarily comprises a board base 210, a plurality of bonding fingers 220, a plating bus loop 230, and a plurality of plating lines 240. The board base 210 has a top surface 211 and a bottom surface 212 where the bottom surface 212 includes a slot-reserved area 213 for manufacturing a wire-bonding slot penetrating through the top surface 211 and the bottom surface 212. Normally the board base 210 is a core layer or consists of a plurality of core layers with at least a metal layer where the material of the core layer is reinforced fiber glasses mixed with dielectric materials such as resins, or epoxy, or polyimide. The "top surface" represents the surface for disposing the chip and the "bottom surface" represents the exposed external surface for disposing external terminals of semiconductor packages such as solder balls. After substrate plating processes, a wire-bonding slot is formed through the slot-reserved area 213 penetrating from the top surface 211 to the bottom surface 212, not shown in the figure. As shown in FIG. 4 and FIG. 5, the slot-reserved area 213 is long and narrow, including two long sides and two short sides. In this embodiment, the long sides of the slot-reserved area 213 are straight lines parallel to each other, the short sides of the slot-reserved area 213 are arc or straight but shorter than the long sides.

As shown in FIG. 5, the bonding fingers 220 are disposed on the bottom surface 212 of the board base 210 adjacent to but not inside the slot-reserved area 213, i.e., arranged along two opposing longer sides of the slot-reserved area 213. Normally, the bonding fingers 220 are internal terminals of the circuit substrate 200 configured for electrically connecting to a plurality of bonding pads of a chip by a plurality of bonding wires or the other electrical connecting components to establish electrical connections between the circuit substrate 200 after slotting and the chip during semiconductor packaging processes.

As shown in FIG. 5 again, the plating bus loop 230 is disposed on the bottom surface 212 of the board base 210 and located inside the slot-reserved area 213. In the present invention, the term of "the plating bus loop 230 located inside the slot-reserved area 213" means that most of the plating bus loop 230 including certain portions or all of two side bars 231 and 232 is located inside the slot-reserved area 213, not limited to all the plating bus loop 230 located inside the slot-reserved area 213. In this embodiment, the plating bus loop 230 further includes two end bars connecting the side bars 231 and 232 so that the plating bus loop 230 is closed.

As shown in FIG. 5, the plating lines 240 are disposed on the bottom surface 212 of the board base 210. The plating lines 240 connect the corresponding bonding fingers 220 to the plating bus loop 230 for plating on the bonding fingers 220. The plating bus loop 230 includes a first side bar 231 and a second side bar 232. The side bars 231 and 232 are closer to the long sides of the slot-reserved area 213 than the bonding fingers 220 to the long sides to shorten the lengths of the plating lines 240 within the slot-reserved area 213. By the plating bus loop 230, the length of each plating line 240 within the slot-reserved area 213 is not more than one-fourth of the width of the slot-reserved area 213.

Normally, the first side bar 231 and the second side bar 232 are parallel to the long sides of the slot-reserved area 213. In the present embodiment but not limited, as shown in FIG. 5, all of the plating bus loop 230 and certain portions of the plating lines 240 are included in the slot-reserved area 213. The lengths of the side bars 231 and 232 may be smaller than the one of the long sides of the slot-reserved area 213. One of the end bars connecting the first side bar 231 with the second side bar 232 is connected with a plating bus line 250. In the present embodiment, the bonding fingers 220, the plating bus loop 230, and the plating lines 240 are formed of the same circuit layer where the circuit layer is formed on the bottom surface 212 of the board base 210. During plating processes, Ni/Au or other metals are plated on the surfaces of the bonding fingers 220 through the plating bus loop 230 and the plating lines 240 to enhance bondability of the bonding fingers 220.

As shown in FIG. 5 and FIG. 6, the plating bus loop 230 is relatively closer to the long sides of the slot-reserved area 213 than the bonding fingers 220. Preferably, the side bars 231 and 232 are with equal lengths, and the plating bus line 250 connects the middle of the end bar connecting the side bars 231 and 232 in order to balance the plating current.

Therefore, the lengths of the plating lines 240 inside the slot-reserved area 213 can be reduced leading to a better slotting quality to avoid metal burrs of the plating lines 240 remaining on the board base 210. Moreover, the plating lines 240 are not pulled and shifted to avoid electrical short between the plating lines 240 and to avoid peeling of the plating lines 240 during routing a wire-bonding slot corresponding to the slot-reserved area 213. Eventually, the quality and the yield of the circuit substrate 200 are enhanced. Furthermore, the plating bus loop 230 can evenly distribute the current to the bonding fingers 220 through the first side bar 231 and the second side bar 232 and the plating lines 240 to improve plating quality and yield on the surfaces of the bonding fingers 220 to avoid issues of different plating thicknesses due to uneven current.

As shown in FIG. 4, in the present embodiment, the circuit substrate 200 further comprises a plurality of external pads 260 disposed on the bottom surface 212 of the board base 210 where the external pads 260 are arranged in an array or in single or multiple rows. The bonding fingers 220 are electrically connected to at least some of the external pads 260 by a circuit pattern formed on the board base 210, not shown in the figure, to be external terminals. The external pads 260 can be round ball pads. To be more specific, as shown in FIG. 6, a solder mask 270 is further formed on the bottom surface 212 of the board base 210 to cover the circuit pattern or to further cover the peripheries of the external pads 260. The solder mask 270 is an insulating material with solder resist characteristics.

The above description of embodiments of this invention is intended to be illustrative and not limiting. Other embodiments of this invention will be obvious to those skilled in the art in view of the above disclosure.

What is claimed is:

1. A circuit substrate primarily comprising:
   a board base having a top surface and a bottom surface, wherein the bottom surface includes a slot-reserved area;
   a plurality of bonding fingers disposed on the bottom surface and adjacent to but outside the slot-reserved area;
   a plating bus loop disposed on the bottom surface and inside the slot-reserved area; and
   a plurality of plating lines disposed on the bottom surface, wherein the plating lines connect the bonding fingers to the plating bus loop;
   wherein the plating bus loop includes two side bars closer to a plurality of long sides of the slot-reserved area than the bonding fingers to the long sides to shorten the lengths of the plating lines within the slot-reserved area.

2. The circuit substrate as claimed in claim 1, wherein the board base is a core layer.

3. The circuit substrate as claimed in claim 1, wherein the length of the plating bus loop is smaller than the one of the slot-reserved area, further comprising a plating bus line connecting at least an end bar of the plating bus loop between the side bars.

4. The circuit substrate as claimed in claim 3, wherein the side bars are with equal lengths, and wherein the plating bus line connects the middle of the end bar.

5. The circuit substrate as claimed in claim 1, further comprising a plurality of external pads disposed on the bottom surface.

6. The circuit substrate as claimed in claim 5, wherein the external pads are round ball pads.

7. The circuit substrate as claimed in claim 1, wherein the bonding fingers, the plating bus loop, and the plating lines are formed of the same circuit layer.

8. The circuit substrate as claimed in claim 1, wherein the side bars are parallel to each other.

9. The circuit substrate as claimed in claim 1, wherein the length of each plating line within the slot-reserved area is not more than one-fourth of the width of the slot-reserved area.

10. The circuit substrate as claimed in claim 1, wherein the plating bus loop further includes two end bars connecting the side bars so that the plating bus loop is closed.

* * * * *